(12) United States Patent
Basu

(10) Patent No.: US 7,912,669 B2
(45) Date of Patent: Mar. 22, 2011

(54) PROGNOSIS OF FAULTS IN ELECTRONIC CIRCUITS

(75) Inventor: Sumit K. Basu, Bangalore (IN)

(73) Assignee: Honeywell International Inc., Morristown, NJ (US)

(*) Notice: Subject to any disclaimer, the term of this patent is extended or adjusted under 35 U.S.C. 154(b) by 652 days.

(21) Appl. No.: 11/728,775

(22) Filed: Mar. 27, 2007

(65) Prior Publication Data

US 2008/0244326 A1   Oct. 2, 2008

(51) Int. Cl.
*G06F 11/00* (2006.01)
(52) U.S. Cl. ............. 702/117; 702/33; 702/34; 702/57; 702/81; 702/82; 702/83; 702/84; 702/118; 702/120; 702/123; 702/124; 702/125; 702/182; 702/183; 714/30; 714/32; 714/39; 714/724; 714/727; 714/732; 714/733; 714/738; 714/745
(58) Field of Classification Search ............. 702/33, 702/34, 57, 81–84, 117–120, 123–125, 182, 702/183; 714/32, 745, 30, 39, 724, 727, 714/732, 733, 738
See application file for complete search history.

(56) References Cited

U.S. PATENT DOCUMENTS

| 6,370,492 | B1* | 4/2002 | Akin ........................... 703/13 |
| 6,378,094 | B1* | 4/2002 | Chakraborty et al. ........ 714/727 |
| 6,421,618 | B1* | 7/2002 | Kliman et al. ................ 702/58 |
| 2004/0168108 | A1* | 8/2004 | Chan et al. .................... 714/47 |
| 2006/0010352 | A1* | 1/2006 | Mukherjee et al. ........... 714/47 |
| 2007/0038911 | A1* | 2/2007 | Koenemann et al. ......... 714/732 |

OTHER PUBLICATIONS

Bushnell et al.,"Essentials of Electronic Testing for Digital, Memory & Mixed-Signal VLSI Circuits," 2001, Library of Congress Cataloging-in-Publication Data, p. 64, 385-412.*
He et al., "A Neural Network Approach for fault Diagnosis of Large-scale Analogue Circuits," Circuit and Systems 2002, ISCAS 2002, IEEE International Symposium, vol. 1, p. I-153-I-156.*
Bandler et al., "Fault diagnosis of analog circuits," Proceedings of the IEEE, vol. 73, Issue 8, Aug. 1985, p. 1279-1352.*
Bushnell et al.,"Essentials of Electronic Testing for Digital, Memory & Mixed-Signal VLSI Circuits," 2001, Library of Congress Cataloging-in-Publication Data, p. 64, 598-604.*
Ramakrishnan, A. , et al., "A life consumption monitoring methodology for electronic systems", *IEEE Transactions on Components and Packaging Technologies, [see also Components, Packaging and Manufacturing Technology, Part A: Packaging Technologies, IEEE Transactions on]*, 26(3), (Sep. 2003),625-634.
Vichare, N. , et al., "Health and Life Consumption Monitoring of Electronic Products", http://www.calce.umd.edu/whats_new/upcoming/2004/workshop/06.pdf, CALCE Team—University of Maryland,(2004),1-35.

* cited by examiner

*Primary Examiner* — Sujoy K Kundu
(74) *Attorney, Agent, or Firm* — Schwegman, Lundberg & Woessner P.A.

(57) ABSTRACT

A process for a prognosis of faults in electronic circuits identifies parameters of a circuit under test. An upper and a lower limit is determined for one or more components of the circuit under test. A population of faulty and non-faulty circuits are generated for the circuit under test, and feature vectors are generated for each faulty and non-faulty circuit. The feature vectors are stored in a fault dictionary, and a feature vector for an implementation of the circuit under test in a field operation is generated. The feature vector for the implementation of the circuit under test in the field operation is compared to the feature vectors in the fault dictionary.

18 Claims, 7 Drawing Sheets

US 7,912,669 B2

PROGNOSIS OF FAULTS IN ELECTRONIC CIRCUITS

TECHNICAL FIELD

Various embodiments relate to electronic circuits, and in an embodiment, but not by way of limitation, to the prediction and prognosis of the failure of such electronic circuits.

BACKGROUND

Electronic systems, such as controllers, computers, navigation systems, avionic systems, medical equipment, and surveillance systems play an increasingly important role in the lives of all people. And as people's dependence on electronics systems increases, so does the need for methods and tools that predict the time to failure and that diagnose faults accurately in these systems.

Current methods for the prediction and prognosis of the failure of electronic systems, such as analog and mixed signal systems, mainly involve two types of approaches. A first approach uses a canary device. A canary device is a replica of an electronic system or component that has been exposed to accelerated stress levels. Because of this exposure to the accelerated stress levels, the canary device is prone to fail before the failure of the actual working device. Therefore, when placed into service in parallel with the actual working device, the failure of the canary device is an indication that the actual working device is likely to fail soon thereafter.

A second approach for the prediction and prognosis of the failure of electronic systems is referred to as a Life Consumption Monitoring method. In this method, a history of environmental stresses (e.g., thermal, vibration, humidity, etc.) that the device has been exposed to is maintained. This environmental history information is then used in conjunction with physics of failure models to compute actual damage to the circuit and then forecast the remaining life of the device.

These current methods however have several shortcomings. The canary device does not actually predict when the device will fail. The failure of the canary device is at best a rough indication of the health of the actual working device. Moreover, if there is a defect in the actual working device, the actual working device may very well fail before the canary device. Additionally, even if the canary device were a better prognosticator, the canary device increases the cost and space requirements of the electronic system.

The Life Consumption Monitoring method depends on accurate data on environmental stresses. To obtain this data, additional environmental sensors have to be deployed. These sensors increase the cost and complexity of the system. Moreover, the possibility that the sensors may be or become faulty makes the predictions unreliable. The development of the model based on the physics of failure theory is not an easy task and requires specialized resources. In the end, the accuracy of the prediction depends on the accuracy of the model. Consequently, the model has to be validated through detailed experimentations, which is resource intensive.

The art is therefore in need of an alternative method to monitor electronic systems and predict the failure of such systems.

SUMMARY

Figure 1:
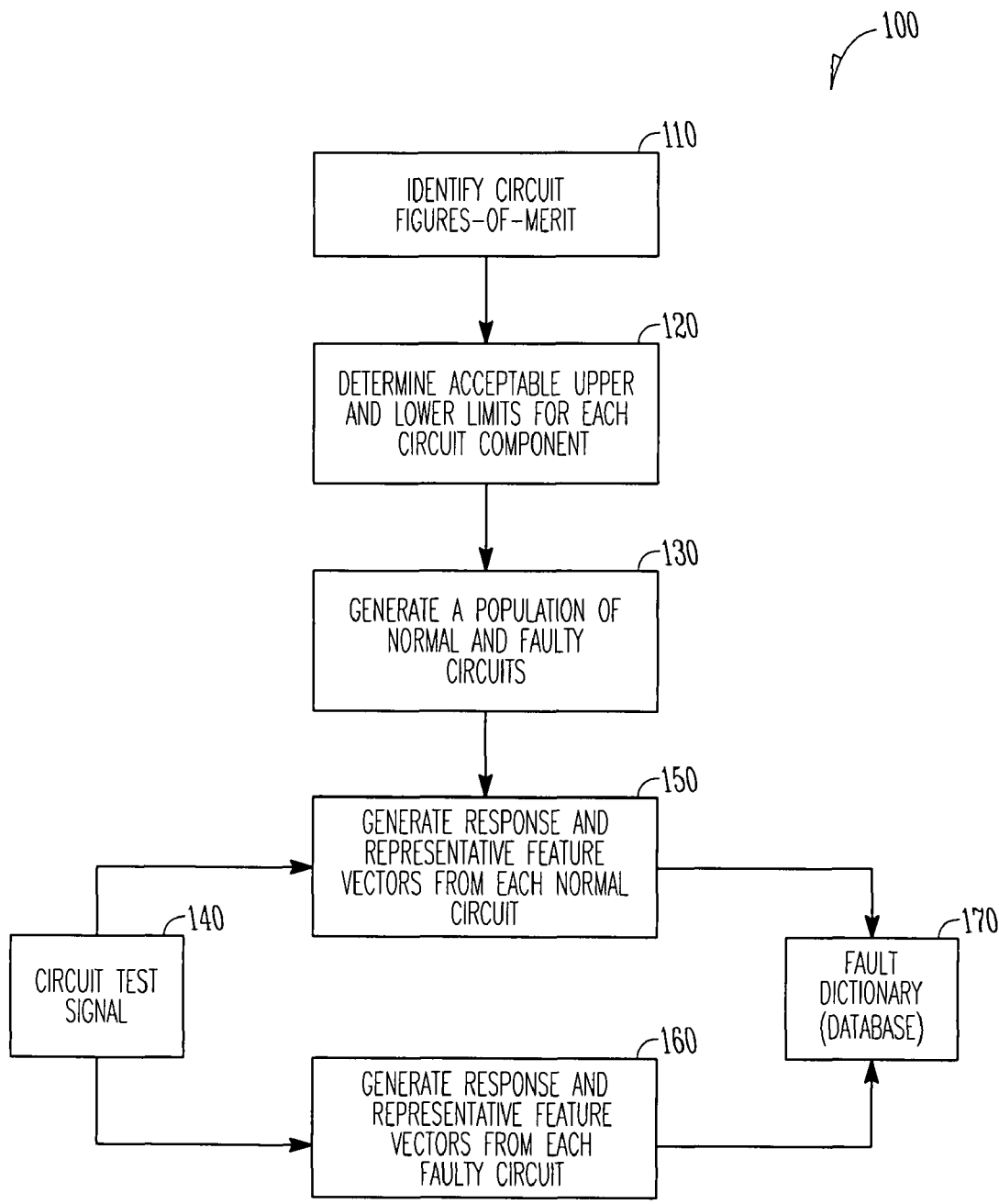
FIG. 1 illustrates an example embodiment of a process for generating a fault dictionary.

A process for a prognosis of faults in electronic circuits identifies parameters of a circuit under test. An upper and a lower limit is determined for one or more components of the circuit under test. A population of faulty and non-faulty circuits are generated for the circuit under test, and feature vectors are generated for each faulty and non-faulty circuit. The feature vectors are stored in a fault dictionary, and a feature vector for an implementation of the circuit under test in a field operation is generated. The feature vector for the implementation of the circuit under test in the field operation is compared to the feature vectors in the fault dictionary.

DETAILED DESCRIPTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Embodiments of the invention include features, methods or processes embodied within machine-executable instructions provided by a machine-readable medium. A machine-readable medium includes any mechanism which provides (i.e., stores and/or transmits) information in a form accessible by a machine (e.g., a computer, a network device, a personal digital assistant, manufacturing tool, any device with a set of one or more processors, etc.). In an exemplary embodiment, a machine-readable medium includes volatile and/or non-volatile media (e.g., read only memory (ROM), random access memory (RAM), magnetic disk storage media, optical storage media, flash memory devices, etc.), as well as electrical, optical, acoustical or other form of propagated signals (e.g., carrier waves, infrared signals, digital signals, etc.).

Such instructions are utilized to cause a general or special purpose processor, programmed with the instructions, to perform methods or processes of the embodiments of the invention. Alternatively, the features or operations of embodiments of the invention are performed by specific hardware components which contain hard-wired logic for performing the operations, or by any combination of programmed data processing components and specific hardware components. Embodiments of the invention include digital/analog signal processing systems, software, data processing hardware, data processing system-implemented methods, and various processing operations, further described herein.

A number of figures show block diagrams of systems and apparatus of embodiments of the invention. A number of figures show flow diagrams illustrating systems and apparatus for such embodiments. The operations of the flow diagrams will be described with references to the systems/apparatuses shown in the block diagrams. However, it should be understood that the operations of the flow diagrams could be performed by embodiments of systems and apparatus other than those discussed with reference to the block diagrams, and embodiments discussed with reference to the systems/apparatus could perform operations different than those discussed with reference to the flow diagrams.

One or more embodiments of the present disclosure provide a system and method to predict the time to failure for an electronic system. Consequently, electronic systems can be installed with a greater assurance that the time to failure for such systems can be more accurately estimated and that such systems can be replaced before any such failure.

FIG. 1 illustrates an example embodiment of a process 100 to generate a fault dictionary 170. The process 100 is a first stage of a two stage embodiment. The process 100 is an offline stage during which at operation 110 a circuit under test is first characterized by means of some figures-of-merit (parameters specific to the particular circuit) that will give an indication of whether the circuit is working normally or not. After this, at operation 120, upper and lower limits for component values (e.g., resistors and capacitors) for each circuit component are determined through experimentation or circuit simulation. This is followed by operation 130 wherein there is a generation of a population of faulty and normal circuits. At operations 150 and 160, the generated responses and representative feature vectors from a circuit test signal 140 for each normal circuit and faulty circuit respectively are collected in the fault dictionary 170.

Figure 2:
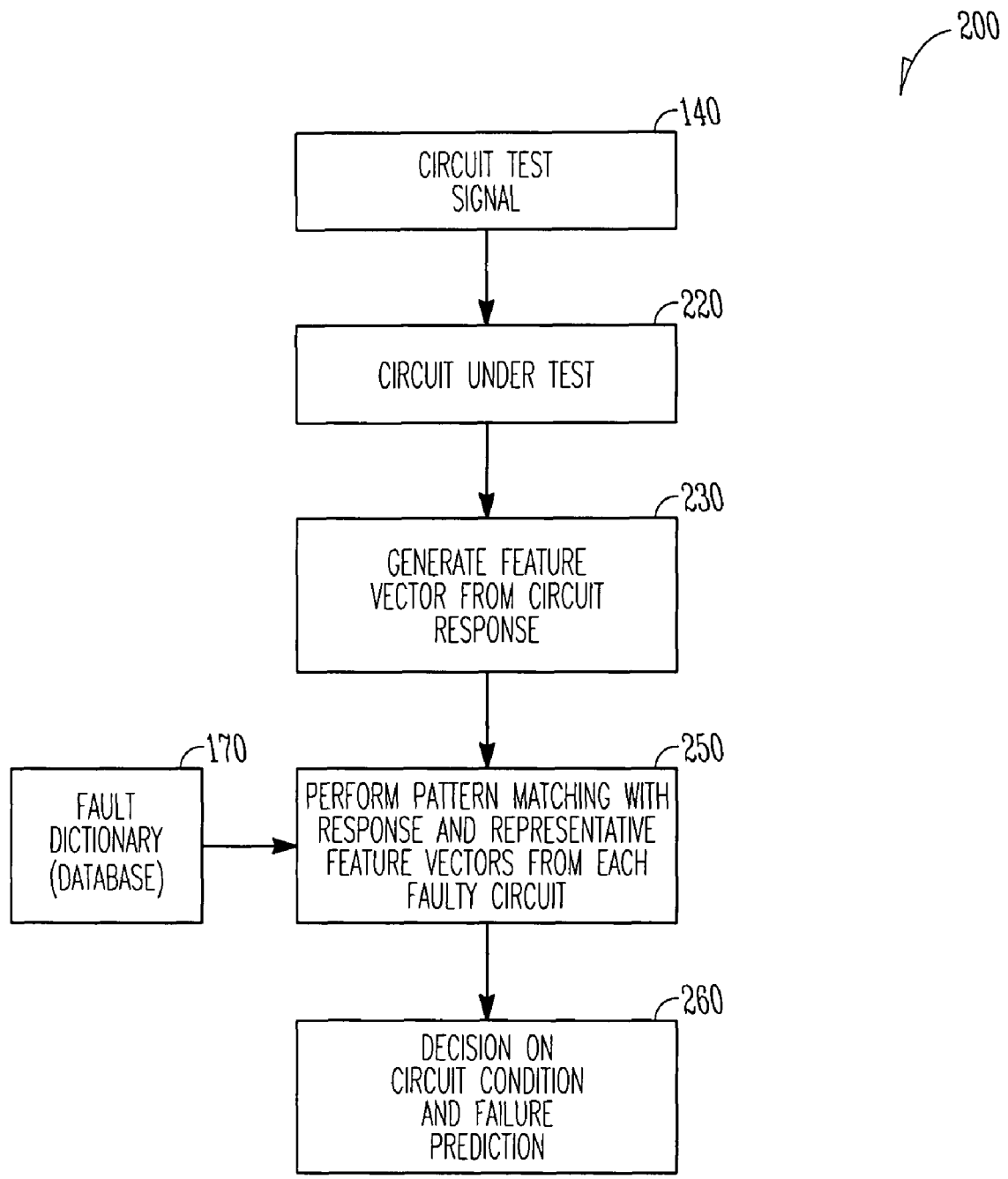
FIG. 2 illustrates an example embodiment of a process for condition monitoring and failure prediction of a circuit under test.

FIG. 2 illustrates a process 200 which in an embodiment serves as a second stage to the process 100 of FIG. 1. In the second stage, which may be an online stage or an offline stage (performed during system maintenance), the circuit test signal 140 is input into a circuit under test 220. The circuit response generates a feature vector at 230. At operation 250, pattern matching is performed with the response and representative feature vectors (from fault dictionary 170) from each faulty circuit. At 260, based on the pattern matching, a decision is made on the circuit condition, and a failure prediction is made.

Figure 8:
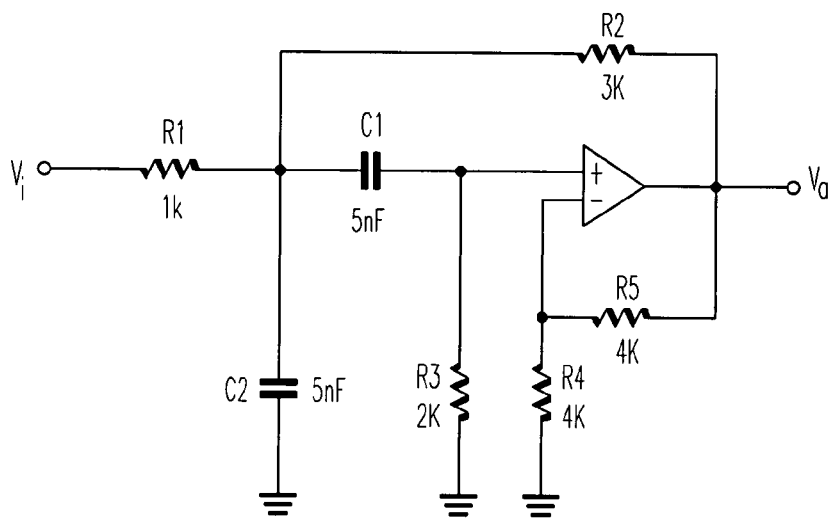
FIG. 8 illustrates an example embodiment of a Sallen-Key bandpass filter.

FIG. 8 illustrates an example embodiment of a Sallen-Key bandpass filter upon which the processes 100 and 200 may be used. Of course any other circuit could be used as well. The nominal values of the circuit components (resistors and capacitors) shown in FIG. 8 result in a center frequency of approximately 160 kHz. In this example, a defect free circuit is a circuit with the nominal values of the resistors and capacitors as shown in FIG. 8. However, the values for the circuit components may have some acceptable deviation from these typical values (±5%, for example).

Some typical filter parameters (figures-of-merit) for the Sallen-Key bandpass filter illustrated in FIG. 8 include a) circuit gain in the passband or at resonance, b) a cutoff or resonant frequency, c) a circuit quality factor or inverse of it (damping factor). The circuit is considered to have failed when one (or more) of the above mentioned circuit specifications or parameters go out of its nominal value by a certain percentage. Accordingly, a circuit component can be assumed to have failed when its value deviates so much from its nominal value that one or more of the above mentioned circuit parameters go out of tolerance. For each component of the circuit, its maximum upper and lower deviations from nominal value that result in the circuit to fail are determined. This is done by changing (increasing or decreasing) the value of each component (one at a time) by a small amount and measuring the values of the circuit parameters, until any of the circuit parameters deviates from its acceptable range. The methods for finding the lower and upper limits for each circuit component is illustrated in FIGS. 3 and 4 respectively.

Figure 3:
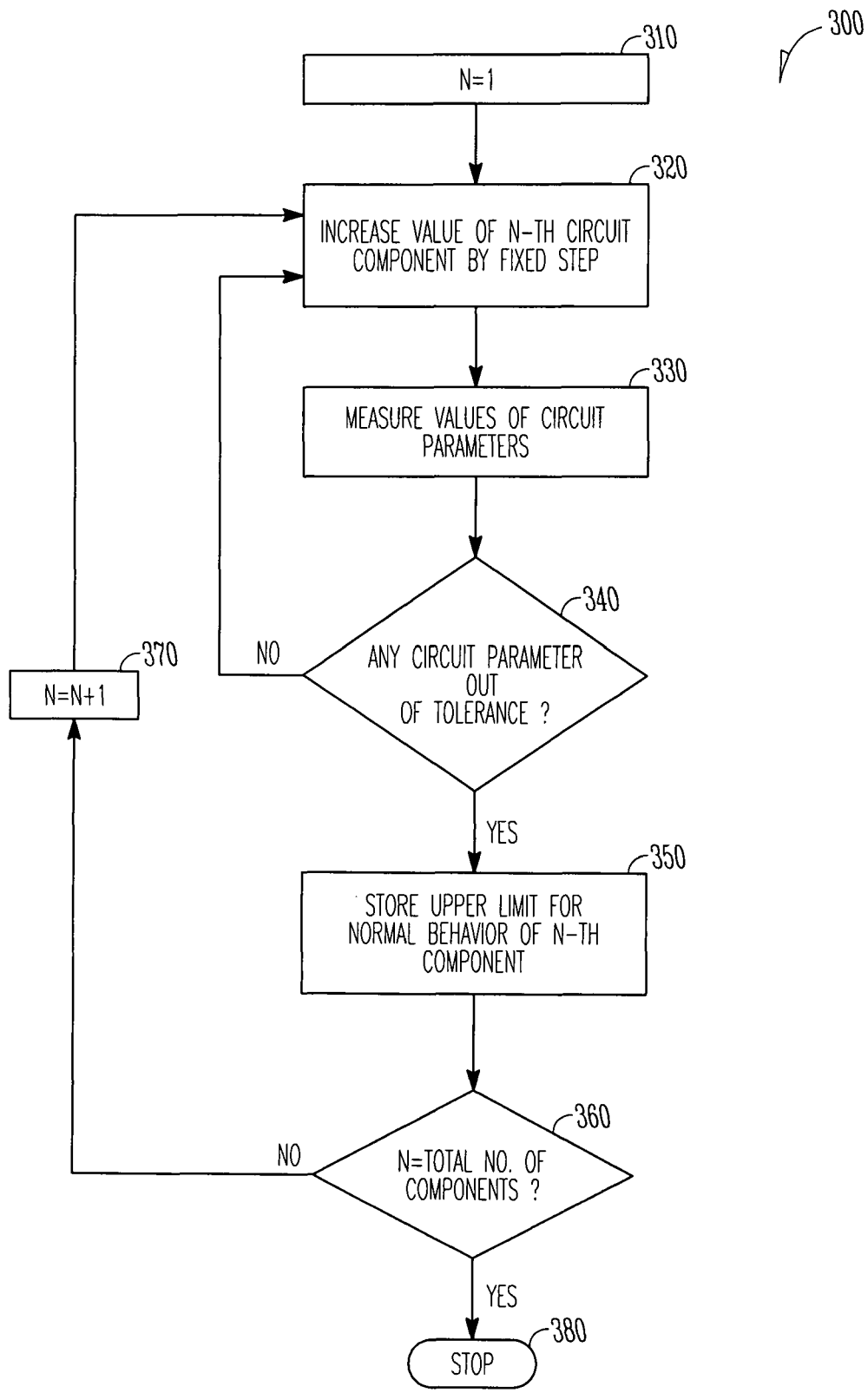
FIG. 3 illustrates an example embodiment of a process for estimating an acceptable upper limit for components in a circuit.

Referring to FIG. 3, a process 300 estimates an acceptable upper limit for component values in a circuit. At 310, a first circuit component is selected, and at 320, the value of the first circuit component is increased by a certain amount. At 330, a measure is taken of the circuit parameters. At 340, if no circuit parameter is out of tolerance, the process 300 increases the value of the circuit component under test. If a circuit component is out of tolerance, the upper limit for normal behavior of this circuit component is stored at 350. If it is determined that there are more components at operation 360, the next circuit component is selected at 370. Otherwise, the process 300 stops at operation 380.

Figure 4:
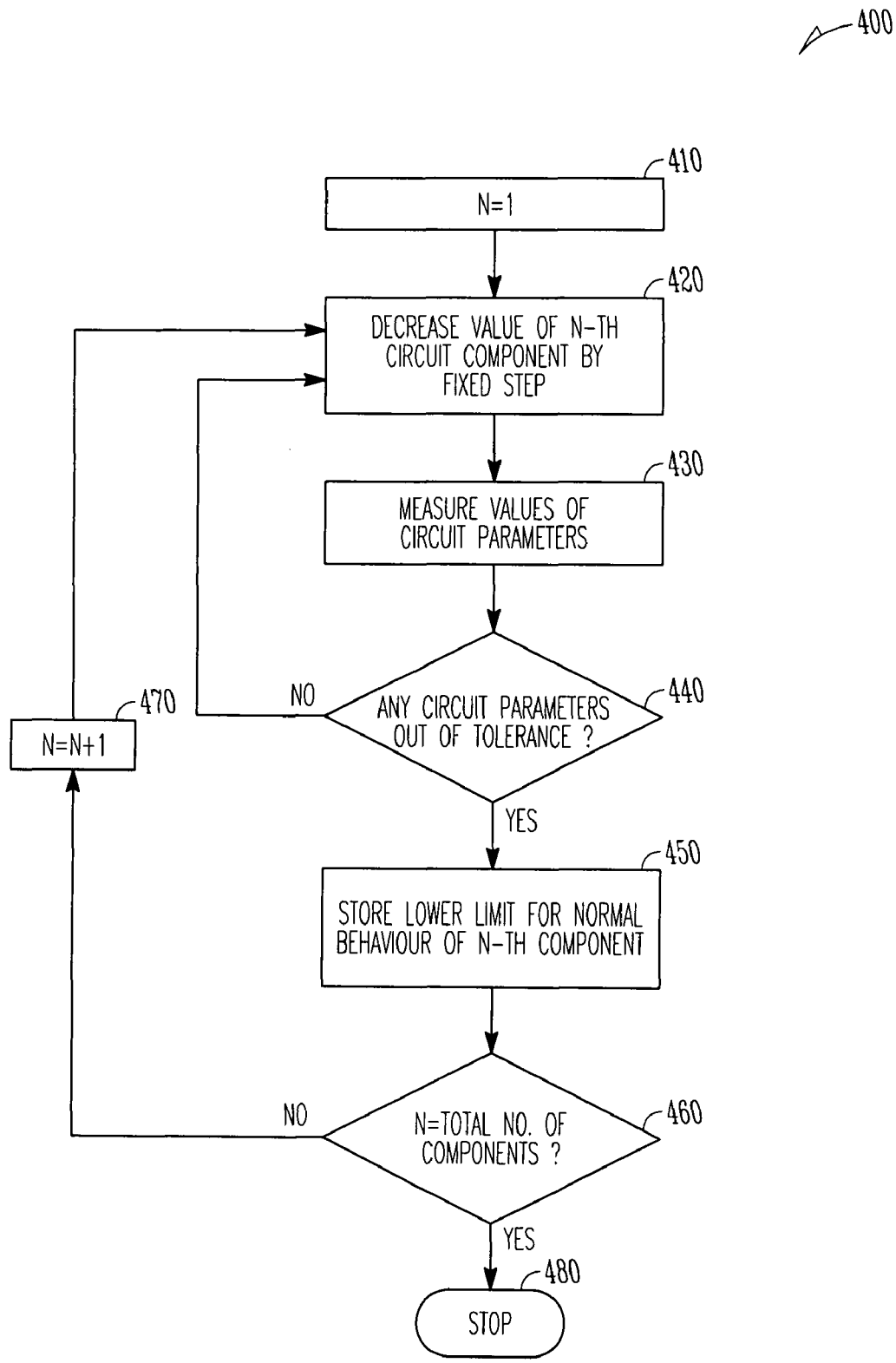
FIG. 4 illustrates an example embodiment of a process for estimating a lower acceptable limit for components in a circuit.

Similarly, referring to FIG. 4, a process 400 estimates an acceptable lower limit for component values in a circuit. At 410, a first circuit component is selected, and at 420, the value of the first circuit component is increased by a certain amount. At 430, a measure is taken of the circuit parameters. At 440, if no circuit parameter is out of tolerance, the process 400 increases the value of the circuit component under test. If a circuit component is out of tolerance, the upper limit for normal behavior of this circuit component is stored at 450. If it is determined that there are more components at operation 460, the next circuit component is selected at 470. Otherwise, the process 400 stops at operation 480.

Although processes 300 and 400 can be done through experimentation, it is normally much more convenient and faster to use a circuit simulation tool for this purpose. Once the upper and lower limits for acceptable behavior for each circuit component are determined, a population of defective circuits can be generated by replacing a component by a faulty component whose value exceeds the range of acceptable values. It may be mentioned here that in some special cases, for some circuit components, the lower limit may be either zero or it may not exist. This is because the lowest value for a resistor or capacitor can only be zero and can not be negative. Also, in some special cases, it may be found that the value of all the circuit parameters may be insensitive to deviation from nominal value of a certain circuit component. In such a case, that particular component is not considered further in the subsequent steps of the procedure.

Figure 5:
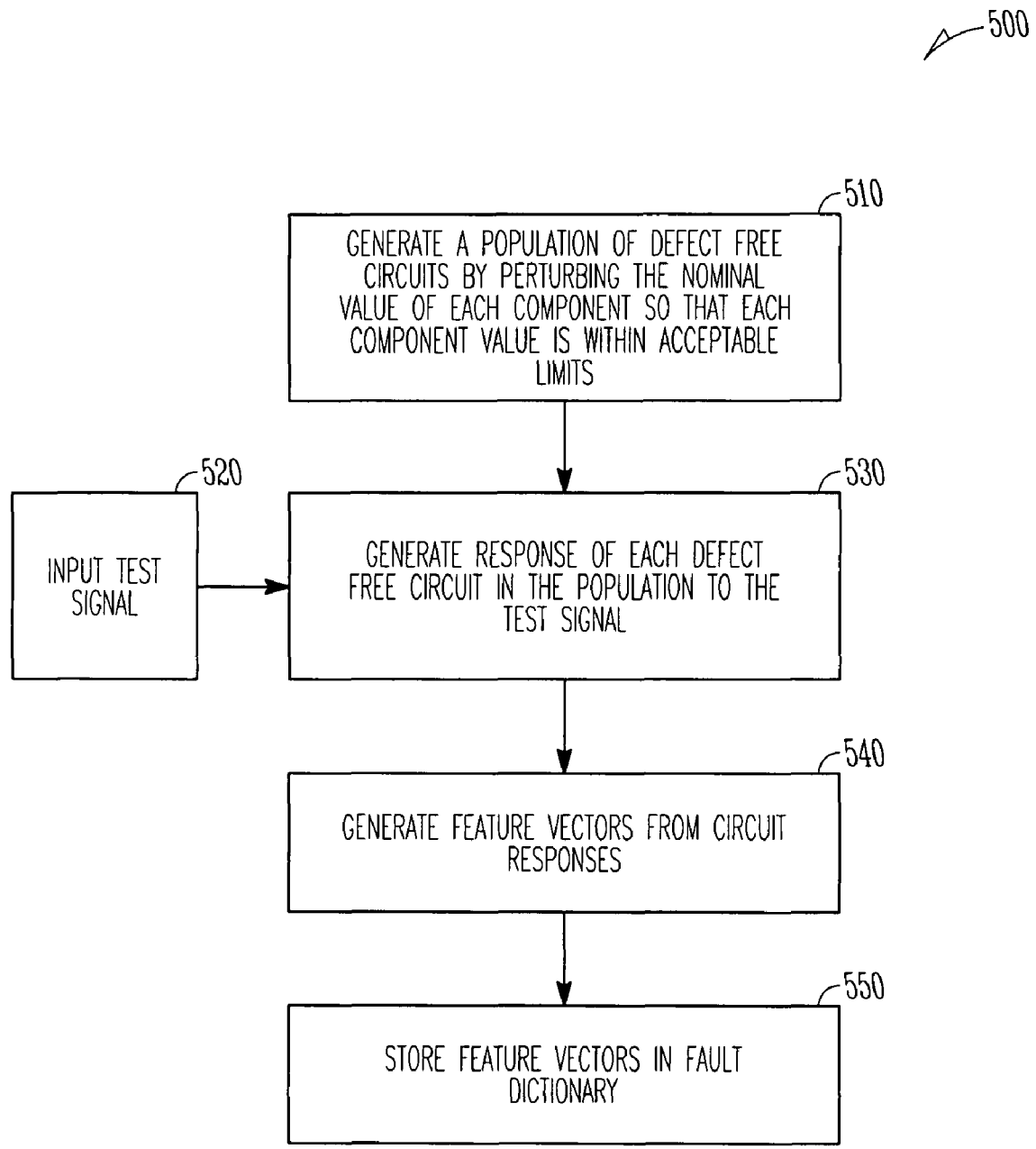
FIG. 5 illustrates an example embodiment of a process for generating a representative set of circuit responses for a defect free circuit.

FIG. 5 illustrates an example embodiment of a process 500 to generate a representative set of circuit responses for a defect free circuit. The process 500 is a second step of the process 100 (i.e., the first stage). At 510, a population of defect free circuits is generated by randomly changing the value of each circuit component so that it remains within the upper and lower limits of acceptable deviation, estimated in the previous processes 300 and 400. At 520, the members of this population are then given a test signal, and at 530, a corresponding response of the defect free circuit is generated. At 540, feature vectors are generated from the circuit response, and at 550, these feature vectors are stored in the fault dictionary 170. The response signal can either be stored as it is, or, one or more characteristic features, estimated from the circuit response, can be stored in the fault dictionary. The features that are computed from the response of the circuit to the test signal for monitoring the condition of the circuit can be based on, for example, time domain analysis, frequency domain analysis or time-frequency domain (wavelet) analysis or any other suitable feature extraction technique.

In general, each response signal can be represented by a multidimensional feature vector. The collection of all the feature vectors generated by giving a specific test signal to the population of defect free circuits forms a cluster in a multidimensional feature space.

Figure 6:
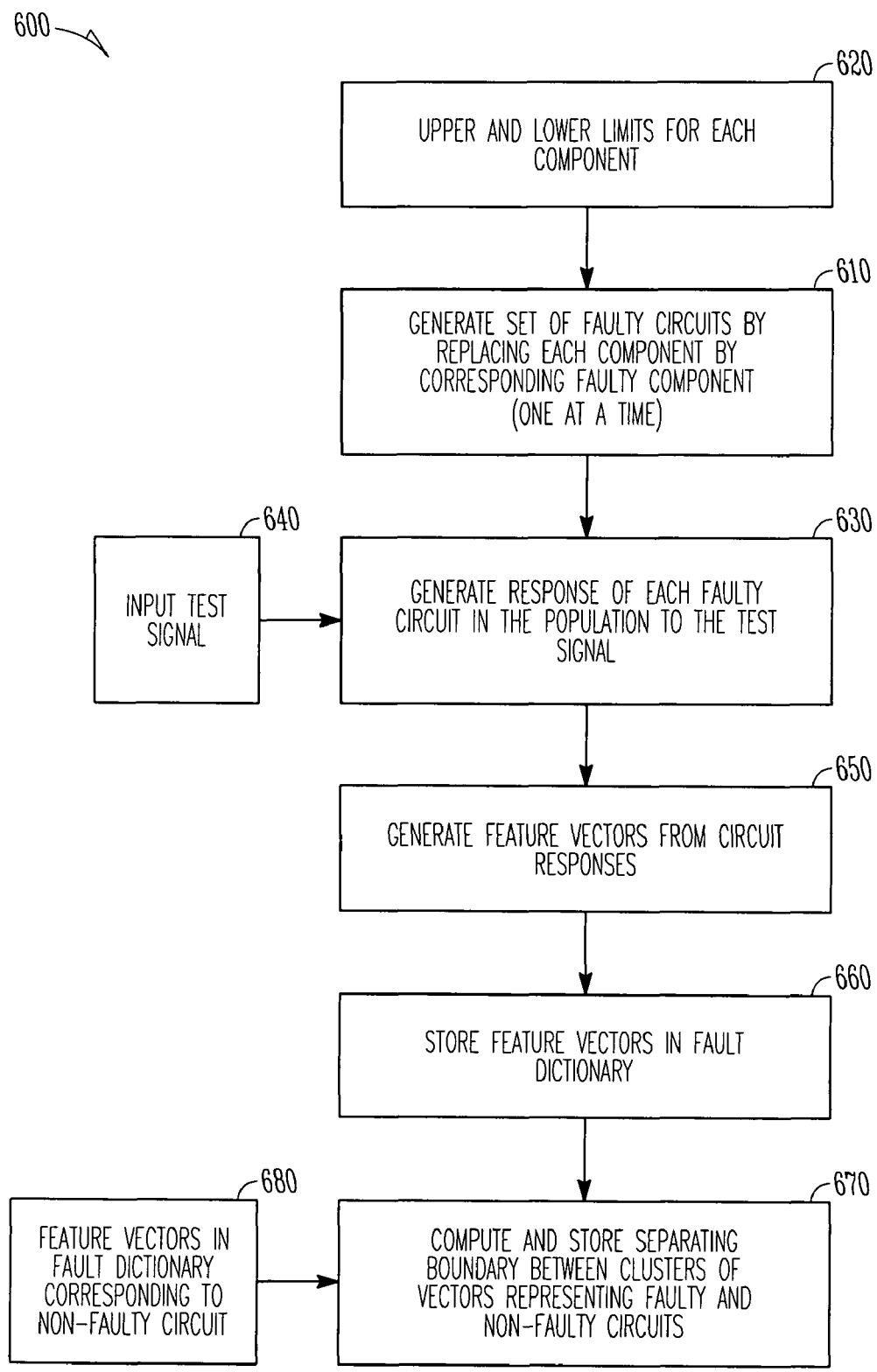
FIG. 6 illustrates an example embodiment of a process for generating a representative set of circuit responses for faulty circuits and for generating a boundary between feature vectors corresponding to faulty and non-faulty circuits.

FIG. 6 illustrates a process 600 which may serve as a third step in this entire process. In the process 600, at 610, a population of faulty circuits is generated by replacing each component by a corresponding faulty component, i.e., a component whose value lies outside the range of acceptable values. For a given faulty component, the number of faulty circuits generated should be equally distributed between values exceeding the upper limit and lower limit at 620. Thus, in general, for each faulty component, there will be two sets of faulty circuits in the population, one corresponding to its value exceeding the upper limit and the other corresponding to its value exceeding the lower limit. At 640, the members of this population are then given the same test signal 140 as in process 200, and at 630, a response is generated for each faulty circuit to the test signal. At 650, feature vectors are generated from the circuit responses, and at 660, the feature vectors corresponding to response of the population of faulty circuits are stored in a fault dictionary. This is similar to the process 200, but in the process 600, the faulty circuit (i.e., the circuit in which one of the components is faulty) is used instead of the defect free circuit. This step generates clusters in feature space corresponding to the response of the population of faulty circuits to the specific test signal. This is repeated for all the components of the circuit, taken one at a time. At 680, the feature vectors corresponding to non-faulty circuits stored in the fault dictionary are used at 670 to compute and store separating boundaries between clusters of vectors representing faulty and non-faulty circuits.

Thus, the above-described processes provide a set of multidimensional feature vectors which form different clusters in a feature space. One of the clusters correspond to response of the normal, non-faulty circuit and each of the remaining clusters correspond to a fault condition, in which one of the components has exceeded the upper and lower limits of acceptable values.

After the clusters are generated, classification techniques such as Support Vector Machine (SVM) or any other standard statistical classification techniques are used for estimating the boundaries between the clusters. Once these boundaries are available, it is straightforward to determine whether a given circuit under test is working normally or has a faulty component by measuring its response to the test signal and determining to which cluster the feature vector corresponding to the response signal belongs. Using the set of feature vectors representing normal condition and set of faulty conditions of the circuit, it is possible to track the gradual progression of a circuit from normal condition to a faulty condition, and extrapolate the time when it is likely to cross the boundary of normal behavior.

Figure 7:
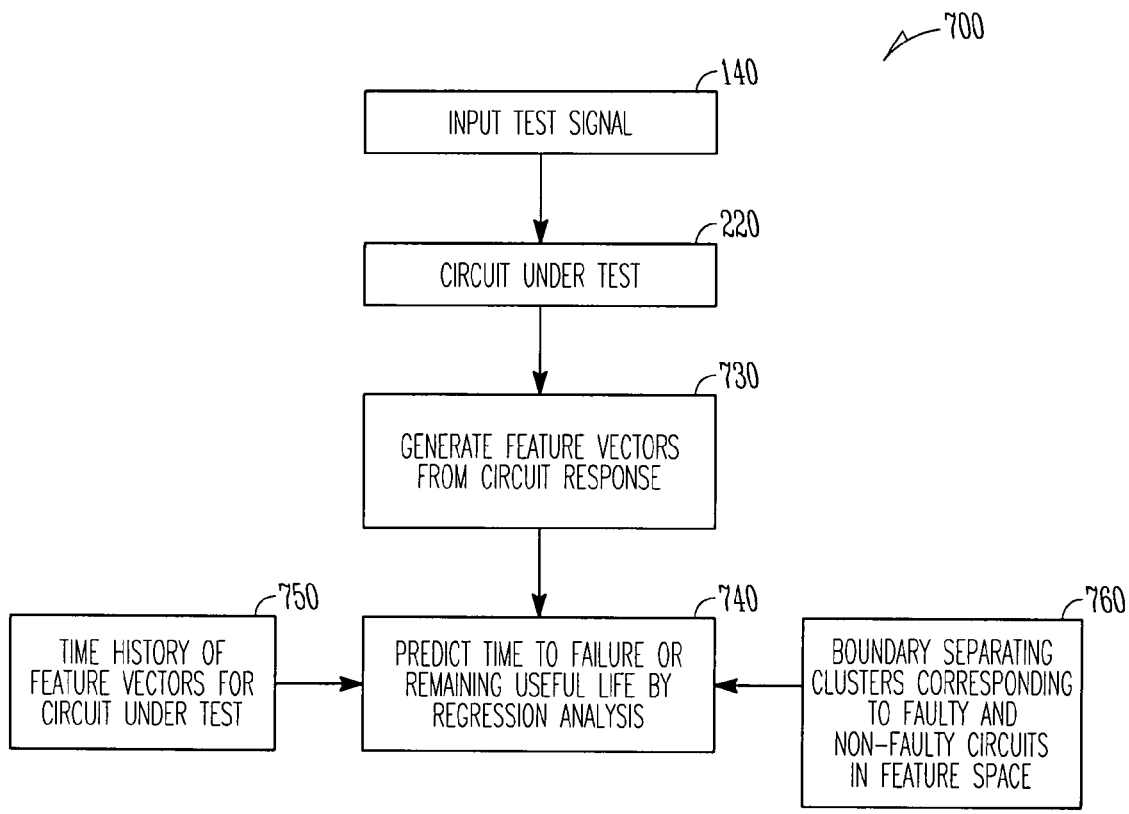
FIG. 7 illustrates an example embodiment of a process for condition monitoring and prediction of the remaining life for a circuit under test.

FIG. 7 illustrates an example embodiment 700 of a second stage of determining the condition of a circuit under test and predicting its remaining useful life. When a circuit is in operation, the same test signal 140 is provided as input to a circuit under test 220 at some periodic interval and its response is measured. This can be done either on-line when the circuit is in operation or off-line when the system is in maintenance. At 730, a feature vector is generated from the circuit response. At 750 and 760, a time history of feature vectors for the circuit under test and boundary separating clusters corresponding to faulty and non-faulty circuits in a feature space are provided. At 740, the time history and clusters are used to predict the time to failure and/or the remaining useful life by a regression analysis. The feature vector corresponding to the response of the fault-free circuit may drift over a period of time towards the boundary that separates the fault-free cluster from the clusters corresponding to the responses of the circuit to various fault conditions. This may happen due to the changes in the component values over a period of time due to aging and various environmental (e.g temperature, humidity) and operational stresses (high current and voltages) that the circuit may undergo during its operation in the field.

For prediction of remaining operational life of the circuit based on measurement of its response to the test signal at different instants of time, a suitable regression algorithm can be used. Candidate methods include multivariate regression, Bayesian regression, time series analysis, Kalman filter, particle filter and neural networks. As feature vectors corresponding to the response of the circuit under test are collected over a period of time, regression models are applied to the data to determine trends. The point of predicted failure is calculated as the intersection of the predicted trend vector and the boundary that separates cluster corresponding to normal operation from any of the clusters corresponding to faulty operations. It may be clarified here that the term 'time' in these discussions does not correspond to elapsed time or calendar time, but to 'running time' or 'usage time' of the circuit.

A major advantage of this method is that as the feature vector representing the behavior of the fault-free circuit drifts through feature space towards the boundary separating faulty-free response from the set of faulty responses, it is possible to estimate which components of the circuit are degraded more than others simply by estimating the distance of the feature vector from the different clusters. The faulty component that corresponds to the cluster nearest to the latest feature vector is the one that has degraded most and may fail earlier than other components. This helps in prolonging the life of the circuit by replacing the components that have degraded more than others. A simple Euclidean distance measure can be used for estimating distances in feature space.

In the foregoing detailed description of embodiments of the invention, various features are grouped together in one or more embodiments for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

The abstract is provided to comply with 37 C.F.R. 1.72(b) to allow a reader to quickly ascertain the nature and gist of the technical disclosure. The Abstract is submitted with the understanding that it will not be used to interpret or limit the scope or meaning of the claims.

The invention claimed is:

1. A process comprising:
   identifying using a computer processor parameters of a circuit under test;
   determining using the computer processor an upper and a lower limit for one or more components of the circuit under test;
   generating using the computer processor a population of faulty and non-faulty circuits for the circuit under test;
   generating using the computer processor feature vectors for each faulty and non-faulty circuit;
   storing into a computer storage medium the feature vectors in a fault dictionary;
   generating using the computer processor a feature vector for an implementation of the circuit under test in a field operation; and
   comparing using the computer processor the feature vector for the implementation of the circuit under test in the field operation to the feature vectors in the fault dictionary;
   wherein the population of non-faulty circuits is generated using the computer processor by:
      assigning a value of a circuit component so that it remains within the upper and lower limits;
      supplying a test signal to each circuit in the population of non-faulty circuits, thereby generating responses of the non-faulty circuits; and
      forming a cluster in a multidimensional feature space of non-faulty circuits from the responses of the non-faulty circuits in the fault dictionary;
   and further wherein the population of faulty circuits is generated using the computer processor by:
      assigning a value of a circuit component so that it falls outside the range of lower and upper limits;
      supplying a test signal to each circuit in the population of faulty circuits, thereby generating responses of the faulty circuits; and
      forming a cluster in a multidimensional feature space of faulty circuits from the responses of the faulty circuits in the fault dictionary;
   estimating using the computer processor boundaries of the cluster of faulty circuits and the cluster of non-faulty circuits; and
   determining using the computer processor whether the circuit under test is faulty or non-faulty as a function of its relation to the cluster of faulty circuits and the cluster of non-faulty circuits.

2. The process of claim 1, wherein the determining the upper limit for the one or more components of the circuit under test comprises:
   selecting a circuit component;
   increasing the value of the circuit component until a circuit parameter becomes out of tolerance; and
   storing the value of the circuit component when the circuit parameter becomes out of tolerance.

3. The process of claim 1, wherein the determining the lower limit for the one or more components of the circuit under test comprises:
   selecting a circuit component;
   decreasing the value of the circuit component until a circuit parameter becomes out of tolerance; and
   storing the value of the circuit component when the circuit parameter becomes out of tolerance.

4. The process of claim 1, wherein a circuit in the population of faulty circuits is generated by replacing a component in the circuit whose value is greater than the upper limit or lower than the lower limit.

5. The process of claim 1, further comprising:
   providing an input signal to the implementation of the circuit under test;
   generating a feature vector from the response of the implementation of the circuit under test; and
   predicting a time to failure of the implementation of the circuit under test using a history of feature vectors stored in the fault dictionary and the clusters of faulty and non-faulty circuits.

6. The process of claim 5, wherein the predicting the time to failure further comprises a regression analysis.

7. A non-transitory computer-readable storage medium comprising instructions stored therein for causing a computer to perform a process comprising:
   identifying parameters of a circuit under test;
   determining an upper and a lower limit for one or more components of the circuit under test;
   generating a population of faulty and non-faulty circuits for the circuit under test;
   generating feature vectors for each faulty and non-faulty circuit;
   storing the feature vectors in a fault dictionary;
   generating a feature vector for an implementation of the circuit under test in a field operation; and
   comparing the feature vector for the implementation of the circuit under test in the field operation to the feature vectors in the fault dictionary;
   wherein the population of non-faulty circuits is generated by:
      assigning a value of a circuit component so that it remains within the upper and lower limits;
      supplying a test signal to each circuit in the population of non-faulty circuits, thereby generating responses of the non-faulty circuits; and
      forming a cluster in a multidimensional feature space of non-faulty circuits from the responses of the non-faulty circuits in the fault dictionary;
   and further wherein the population of faulty circuits is generated by:
      assigning a value of a circuit component so that it falls outside the range of lower and upper limits;
      supplying a test signal to each circuit in the population of faulty circuits, thereby generating responses of the non-faulty circuits; and
      forming a cluster in a multidimensional feature space of faulty circuits from the responses of the faulty circuits in the fault dictionary;

and wherein the comparing the feature vector for the implementation of the circuit under test in the field operation to the feature vectors in the fault dictionary comprises:
estimating boundaries between clusters of faulty and non-faulty circuits; and
determining a cluster to which the feature vector for the circuit under test belongs as a function of a proximity of the vector to the boundaries of the clusters.

8. The tangible machine readable storage medium of claim 7, wherein the determining the upper limit for the one or more components of the circuit under test comprises instructions for:
selecting a circuit component;
increasing the value of the circuit component until a circuit parameter becomes out of tolerance; and
storing the value of the circuit component when the circuit parameter becomes out of tolerance.

9. The tangible machine readable storage medium of claim 7, wherein the determining the lower limit for the one or more components of the circuit under test comprises instructions for:
selecting a circuit component;
decreasing the value of the circuit component until a circuit parameter becomes out of tolerance; and
storing the value of the circuit component when the circuit parameter becomes out of tolerance.

10. The tangible machine readable storage medium of claim 7, wherein a circuit in the population of faulty circuits is generated by replacing a component in the circuit whose value is greater than the upper limit or lower than the lower limit.

11. The tangible machine readable storage medium of claim 7, further comprising instructions for:
providing an input signal to the implementation of the circuit under test;
generating a feature vector from the response of the implementation of the circuit under test; and
predicting a time to failure of the implementation of the circuit under test using a history of feature vectors stored in the fault dictionary and the clusters of faulty and non-faulty circuits.

12. The tangible machine readable storage medium of claim 11, wherein the predicting the time to failure further comprises a regression analysis.

13. A system comprising:
a computer processor configured for identifying parameters of a circuit under test;
a computer processor configured for determining an upper and a lower limit for one or more components of the circuit under test;
a computer processor configured for generating a population of faulty and non-faulty circuits for the circuit under test;
a computer processor configured for generating feature vectors for each faulty and non-faulty circuit;
a computer processor configured for storing the feature vectors in a fault dictionary;
a computer processor configured for generating a feature vector for an implementation of the circuit under test in a field operation; and
a computer processor configured for comparing the feature vector for the implementation of the circuit under test in the field operation to the feature vectors in the fault dictionary;
wherein the population of non-faulty circuits is generated by:
a computer processor configured for assigning a value of a circuit component so that it remains within the upper and lower limits;
a computer processor configured for supplying a test signal to each circuit in the population of non-faulty circuits, thereby generating responses of the non-faulty circuits; and
a computer processor configured for forming a cluster in a multidimensional feature space of non-faulty circuits from the responses of the non-faulty circuits in the fault dictionary;
and further wherein the population of faulty circuits is generated by:
a computer processor configured for assigning a value of a circuit component so that it falls outside the range of lower and upper limits;
a computer processor configured for supplying a test signal to each circuit in the population of faulty circuits, thereby generating responses of the non-faulty circuits; and
a computer processor configured for forming a cluster in a multidimensional feature space of faulty circuits from the responses of the faulty circuits in the fault dictionary;
and wherein the comparing the feature vector for the implementation of the circuit under test in the field operation to the feature vectors in the fault dictionary comprises:
estimating boundaries between clusters of faulty and non-faulty circuits; and
determining a cluster to which the feature vector for the circuit under test belongs as a function of a proximity of the vector to the boundaries of the clusters.

14. The system of claim 13, wherein the processor configured for determining the upper limit for the one or more components of the circuit under test comprises:
a computer processor configured for selecting a circuit component;
a computer processor configured for increasing the value of the circuit component until a circuit parameter becomes out of tolerance; and
a computer processor configured for storing the value of the circuit component when the circuit parameter becomes out of tolerance.

15. The system of claim 13, wherein the processor configured for determining the lower limit for the one or more components of the circuit under test comprises:
a computer processor configured for selecting a circuit component;
a computer processor configured for decreasing the value of the circuit component until a circuit parameter becomes out of tolerance; and
a computer processor configured for storing the value of the circuit component when the circuit parameter becomes out of tolerance.

16. The system of claim 13, wherein a circuit in the population of faulty circuits is generated by replacing a component in the circuit whose value is greater than the upper limit or lower than the lower limit.

17. The system of claim 13, further comprising:
a computer processor configured for providing an input signal to the implementation of the circuit under test;
a computer processor configured for generating a feature vector from the response of the implementation of the circuit under test; and
a computer processor configured for predicting a time to failure of the implementation of the circuit under test using a history of feature vectors stored in the fault dictionary and the clusters of faulty and non-faulty circuits;
wherein the predicting the time to failure further comprises a regression analysis.

18. The process of claim 1, comprising using the feature vectors stored in the fault dictionary for the faulty and non-faulty circuits and the feature vector for an implementation of the circuit under test in a field operation to track a progression of the circuit under test from a normal condition to a faulty condition.

* * * * *